United States Patent
Manasterski et al.

(10) Patent No.: US 11,345,993 B2
(45) Date of Patent: *May 31, 2022

(54) METHOD FOR ENHANCING THE ADHESION OF A LAYER FOR THE PROTECTION OF SILVER AGAINST TARNISHING ON A SUBSTRATE COMPRISING A SILVER SURFACE

(71) Applicant: The Swatch Group Research and Development Ltd, Marin (CH)

(72) Inventors: Christian Manasterski, Colombier (CH); Vladislav Spassov, Praz (CH); Cedric Faure, Cortaillod (CH)

(73) Assignee: The Swatch Group Research and Development Ltd, Marin (CH)

( * ) Notice: Subject to any disclaimer, the term of this patent is extended or adjusted under 35 U.S.C. 154(b) by 89 days.

This patent is subject to a terminal disclaimer.

(21) Appl. No.: 16/572,203

(22) Filed: Sep. 16, 2019

(65) Prior Publication Data

US 2020/0095673 A1 Mar. 26, 2020

(30) Foreign Application Priority Data

Sep. 21, 2018 (EP) .................................. 18195859

(51) Int. Cl.
| | |
|---|---|
| *C23C 16/06* | (2006.01) |
| *C23C 16/02* | (2006.01) |
| *C23C 16/40* | (2006.01) |
| *C23C 16/455* | (2006.01) |
| *C23C 16/56* | (2006.01) |
| *G04B 19/12* | (2006.01) |
| *C22C 5/08* | (2006.01) |

(52) U.S. Cl.
CPC ............... *C23C 16/06* (2013.01); *C22C 5/08* (2013.01); *C23C 16/0272* (2013.01); *C23C 16/403* (2013.01); *C23C 16/405* (2013.01); *C23C 16/45525* (2013.01); *C23C 16/56* (2013.01); *G04B 19/12* (2013.01)

(58) Field of Classification Search
None
See application file for complete search history.

(56) References Cited

U.S. PATENT DOCUMENTS

| 10,072,335 B2 | 9/2018 | Marquardt et al. |
| 2009/0004386 A1 | 1/2009 | Makela et al. |
| 2012/0021138 A1* | 1/2012 | Ditizio .................. C23C 16/409 |
| | | 427/539 |
| 2014/0335272 A1 | 11/2014 | Makela et al. |
| 2015/0194234 A1 | 7/2015 | Shin et al. |
| 2016/0060758 A1* | 3/2016 | Marquardt ........ C23C 16/45553 |
| | | 428/216 |

FOREIGN PATENT DOCUMENTS

| CH | 711 122 A2 | 11/2016 | |
| CH | 711122 A2 * | 11/2016 | ......... C23C 28/3455 |
| CN | 2080065 U | 7/1991 | |
| CN | 1257588 A | 6/2000 | |
| CN | 102089684 A | 6/2011 | |
| CN | 104109844 A | 10/2014 | |
| EP | 1 994 202 A1 | 11/2008 | |
| JP | 63-213655 A | 9/1988 | |
| JP | 2006-250654 A | 9/2006 | |
| WO | WO 2007/088249 A1 | 8/2007 | |
| WO | WO-2007088249 A1 * | 8/2007 | ....... C23C 16/45555 |

OTHER PUBLICATIONS

Office Action dated Nov. 4, 2020 in corresponding Japanese Patent Application No. 2019-165900 (with English Translation), 7 pages.
European Search Report dated Mar. 28, 2019 in European Application 18195859.6, filed Sep. 21, 2018 (with English Translation of Categories of Cited Documents).
Combined Chinese of Office Action and Search Report dated May 8, 2021 in Chinese Patent Application No. 201910892742.2 (with English translation), 29 pages.

* cited by examiner

*Primary Examiner* — Jose I Hernandez-Kenney
(74) *Attorney, Agent, or Firm* — Oblon, McClelland, Maier & Neustadt, L.L.P.

(57) ABSTRACT

A method is described for protecting a silver surface against tarnishing. This involves depositing a layer of a silver-copper alloy on a substrate, which may be a silver substrate. The alloy comprises between 0.1 wt % and 10 wt % of copper relative to the total weight of the alloy. At least one layer of a metal oxide or a nitride having a thickness in a range of 1 nm to 200 nm is deposited on the alloy to protect against tarnishing. The presence of copper in the silver-copper alloy enhances the alloy's adhesion without altering the silver color.

28 Claims, 1 Drawing Sheet

METHOD FOR ENHANCING THE ADHESION OF A LAYER FOR THE PROTECTION OF SILVER AGAINST TARNISHING ON A SUBSTRATE COMPRISING A SILVER SURFACE

CROSS-REFERENCE TO RELATED APPLICATION

This application claims priority to European Patent Application No. 18195859.6 filed on Sep. 21, 2018, the entire disclosure of which is hereby incorporated herein by reference.

FIELD OF THE INVENTION

The invention relates to a method for enhancing the adhesion of a layer for the protection of silver against tarnishing on a substrate comprising a silver surface. Such a substrate comprising a silver surface is in particular a horological element coated in a thin layer of silver.

BACKGROUND OF THE INVENTION

In the horology field, a horological element is commonly made by coating a substrate with a thin layer of silver, preferably deposited galvanically, in order to provide the horological element with the very white and unique appearance of silver. Such a horological element is, for example, a dial, made of brass or gold, coated in a thin layer of silver.

However, silver has the drawback of tarnishing over time. Known solutions for overcoming this problem involve protecting the sensitive silver surface of the horological element by cellulose varnishing. Cellulose varnish is a varnish that can be diluted in a solvent. Cellulose varnishing is a method that consists of applying a plurality of layers of cellulose varnish to the surfaces to be protected, for example by spraying, then of passing same in an oven to accelerate the hardening thereof. The final coating has a total thickness of about 8 to 15 µm.

However, this cellulose varnish does not provide perfect protection of the sensitive metals. Moreover, the thickness of the cellulose varnish that must be deposited fills in the fine structuring details, such as the guilloché work often used to decorate a dial. As a result, the details of the guilloché work are not showcased, and can even disappear under the layers of varnish. Finally, the layers of cellulose varnish change the colour and the appearance of the protected silver surface by varying the L* parameter (of the CIE L*a*b* colour space).

To replace the cellulose varnishing method, the deposition of a protective layer on the sensitive silver surface by an ALD method has been proposed, as described in the patent document EP 1 994 202. This method enables the deposition of an extremely thin (50 nm to 100 nm) and highly protective coating, the protection obtained being greater than the protection obtained with a 10 µm coating of cellulose varnish.

However, this ALD method has the main drawback of forming, on the silver surface of the substrate, a protective layer with low adhesion to said silver surface, such that said protective layer deposited by ALD becomes delaminated upon the slightest solicitation, for example during final decoration operations by pad printing or other methods.

Furthermore, the use of an unsuitable protective layer deposited on the silver surface of the substrate can have the drawback of attenuating the shine and colour of the silver and of modifying the aesthetic outcome of the silver surface.

SUMMARY OF THE INVENTION

The purpose of the present invention is to overcome these drawbacks by proposing a method for enhancing the adhesion of a layer for the protection of silver against tarnishing on a substrate comprising a silver surface.

The present invention further aims to propose a method enabling a substrate to be obtained, which substrate has a silver surface that is effectively protected against silver tarnishing while preserving the final appearance of said silver surface.

For this purpose, the invention relates to a method for enhancing the adhesion of a layer for the protection of silver against tarnishing on a substrate comprising a final silver surface, characterised in that it comprises the following steps of:

a) obtaining a substrate that may or may not have an initial silver surface b) depositing on said substrate of step a) a layer of a silver-copper alloy comprising between 0.1 wt % and 10 wt % of copper relative to the total weight of the alloy in order to obtain said final silver surface c) depositing on at least one part of said final silver surface obtained in step b) at least one layer for the protection of silver against tarnishing having a thickness that lies in the range 1 nm to 200 nm, preferentially in the range 40 nm to 100 nm.

The present invention further relates to the use of a layer of a silver-copper alloy comprising between 0.1 wt % and 10 wt % of copper relative to the total weight of the alloy deposited on a substrate that may or may not have an initial silver surface in order to obtain a substrate having a final silver surface, so as to enhance the adhesion of a layer for the protection of silver against tarnishing deposited on said final silver surface, said layer for the protection of silver against tarnishing having a thickness that lies in the range 1 nm to 200 nm, preferentially in the range 40 nm to 100 nm.

The use of such a silver-copper alloy layer deposited on a substrate enables Cu radicals to be created on the surface, which will enable the adhesion of the layer for the protection of silver against tarnishing while preserving the silvery shine of the substrate.

BRIEF DESCRIPTION OF THE DRAWINGS

Other specific features and advantages will be clearly observed in the following description, which is given as a rough guide and in no way as a limited guide, with reference to the accompanying figures, in which.

DETAILED DESCRIPTION OF THE PREFERRED EMBODIMENTS

The present invention relates to a method for enhancing the adhesion of a layer for the protection of silver against tarnishing on a substrate comprising a final silver surface.

The first step a) of the method according to the invention consists of obtaining a substrate 1 that may or may not have an initial silver surface.

Such a substrate is, for example, a horological element or a jewellery element, and in particular an external horological element. In particular, the substrate can be a dial of a timepiece, which can have, on the surface thereof, a structuring, such as guilloché work, i.e. a set of lines with fine details, which cross to give a decorative effect. For this purpose, step a) of the method comprises a sub-step according to which said structuring is produced on the surface of the substrate.

The substrate 1 is preferably made of metal. It can be made of brass, have a yellow or white gold base, or a silver base, or be made of any other suitable metal or metal alloy, that may or may not be precious.

Figure 1:
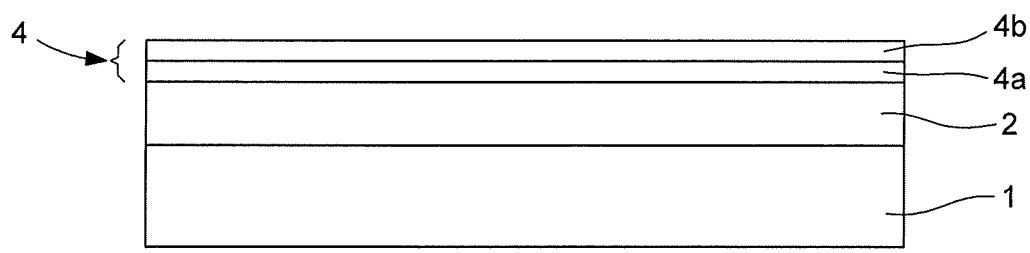
FIG. 1 is a diagrammatic view of a first alternative embodiment of a substrate treated according to the present invention.

FIG. 1 shows a substrate 1 treated according to a first alternative embodiment of the invention according to which the substrate 1 may have no initial silver surface or may comprise an intrinsic silver surface. In the first case, the substrate can be, for example, made of brass, have a yellow or white gold base, or be made of any other suitable metal or metal alloy, that may or may not be precious, with the exception of silver. In the second case, the substrate 1 is silver-based, for example made of solid silver, and intrinsically has an initial silver surface.

Figure 2:
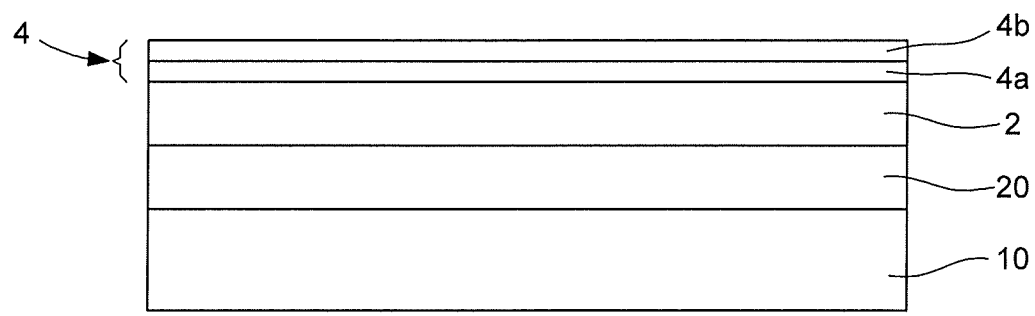
FIG. 2 is a diagrammatic view of a second alternative embodiment of a substrate treated according to the present invention.

FIG. 2 shows a substrate 10 treated according to a second alternative embodiment of the invention according to which the substrate 10 is not silver-based and comprises an initial silver surface obtained by deposition, according to a sub-step of step a), of an intermediate layer 20 of substantially pure silver on said substrate 10. Such a layer 20 is preferably deposited galvanically. The substrate 10 can itself be made of brass and coated in a layer of precious metal, for example deposited galvanically, for example a layer of gold. The substrate 10 can also be made of a solid precious metal, for example solid gold.

Said layer 20 of substantially pure silver can have a thickness that lies in the range 200 nm to 3,000 nm.

According to one embodiment, the layer 20 of substantially pure silver has a thickness that lies in the range 200 nm to 600 nm, preferably in the range 300 nm to 500 nm in order to form a thin silver coating.

According to another embodiment, the layer 20 of substantially pure silver has a thickness that lies in the range 1,000 nm to 3,000 nm, preferably in the range 1,500 nm to 2,500 nm in order to form a thick silver coating.

Such a thick silver coating has the advantage of obtaining an intermediate layer of substantially pure silver that is free from porosities, in order to subsequently obtain, as will be seen hereinafter, a silver-copper layer according to step b) without porosities and thus ensure increased adhesion of the layer for the protection of silver against tarnishing on said silver-copper layer.

According to the invention, the substrate 1, 10 of step a) is then treated according to step b), which consists of depositing on said substrate 1, 10 of step a) a silver-copper alloy layer 2 comprising between 0.1 wt % and 10 wt % of copper relative to the total weight of the alloy in order to obtain a substrate 1, 10 having a final silver surface.

Preferably, the silver-copper alloy layer 2 has a thickness that lies in the range 200 nm to 600 nm, more preferentially in the range 300 nm to 400 nm.

Preferably, the silver-copper alloy comprises between 0.2 wt % and 8 wt %, preferably between 0.5 wt % and 7 wt % of copper relative to the total weight of the alloy. The proportion of copper relative to silver is chosen so as to create a sufficient amount of Cu radicals on the surface, which will then ensure the adhesion of the layer for the protection of silver against tarnishing, without altering the colour of the silver since the silver-copper alloy layer forms the final silver surface of the substrate.

The silver-copper alloy layer 2 can be directly deposited on the substrate 1 as shown in FIG. 1 and can replace the thin silver coating conventionally used. The silver-copper alloy layer 2 can further be deposited on the intermediate layer of substantially pure silver 20 as shown in FIG. 2. The silver-copper alloy layer 2 can be deposited by any suitable method, such as PVD (strike plating), or galvanically by means of a suitable silver and copper galvanic bath.

Step c) of the method of the invention then consists of depositing on at least one part of the final silver surface obtained in step b) at least one layer 4 for the protection of silver against tarnishing having a thickness that lies in the range 1 nm to 200 nm, preferably in the range 1 nm to 100 nm, and more preferentially in the range 40 nm to 100 nm.

Step c) can be carried out by a method chosen from the group comprising ALD (Atomic Layer Deposition), PVD (Physical Vapour Deposition), CVD (Chemical Vapour Deposition) and sol-gel. Preferably, step c) is carried out by ALD for forming compact layers and obtaining extremely thin and highly protective coatings, with a particularly good aesthetic outcome. The details and parameters of such an ALD method are known to a person skilled in the art. They are, for example, described in the patent document EP 1 994 202. The $Al_2O_3$ layer can be obtained from a TMA (trimethylaluminium) precursor, the oxidation whereof can be carried out with $H_2O$, $O_2$; or even $O_3$. The $TiO_2$ layer can be obtained from TTIP (titanium tetraisopropoxide) or $TiCl_4$ (titanium trichloride), the oxidation whereof can be carried out by $H_2O$, $O_2$ or $O_3$.

Advantageously, to produce the layer 4 for the protection of silver against tarnishing deposited in step c) a metal oxide is used, which is ideally as transparent as possible according to the desired thicknesses, preferentially chosen from the group consisting of $Al_2O_3$, $Ta_2O_5$, $HfO_2$, ZnO, $SiO_2$, and $TiO_2$. Nitrides can also be used, such as $Si_xN_y$. A stack of different layers is also possible.

Preferably, step c) comprises a step c1) of depositing, on at least one part of said final silver surface obtained in step b), a first $Al_2O_3$ layer 4a and a step c2) of depositing, on the first $Al_2O_3$ layer 4a obtained in step c1), a second $TiO_2$ layer 4b.

Advantageously, the first $Al_2O_3$ layer 4a has a thickness that lies in the range 0.5 nm to 100 nm, preferably in the range 0.5 nm to 50 nm, and the second $TiO_2$ layer 4b has a thickness that lies in the range 0.5 nm to 100 nm, preferably in the range 0.5 nm to 50 nm.

More preferentially, the first $Al_2O_3$ layer 4a has a thickness that lies in the range 30 nm to 50 nm, and the second $TiO_2$ layer 4b has a thickness that lies in the range 10 nm to 50 nm.

In a particularly preferred manner, the layer 4 for the protection of silver against tarnishing is obtained by ALD of a first $Al_2O_3$ layer having a thickness that lies in the range 30 nm to 50 nm and a second $TiO_2$ layer 4b having a thickness that lies in the range 10 nm to 50 nm.

Such a combination of a first $Al_2O_3$ layer 4a and a second $TiO_2$ layer 4b having the thicknesses stipulated hereinabove enhances the white colour of the silver.

Advantageously, the method of the invention can combine the deposition of protective layers and plasma treatment, before and/or after step c2), typically using an Ar plasma, in order to reduce the internal stresses of the protective layers deposited. This combination enables the protective layers to be made more flexible so as to render them less breakable under environmental solicitations, such as mechanical, thermal or other solicitations.

Advantageously, the method of the invention can comprise, between step b) and step c), at least one step d) of pre-treating the final silver surface of the substrate obtained in step b) using plasma.

This plasma pre-treatment step d) consists of pickling the final silver surface of the substrate in particular in order to remove the AgS/Ag$_2$S sulphides which have naturally formed on the surface of the substrate exposed to air and which prevent good adhesion of the protective layer 4.

Advantageously, this step d) consists of an Ar plasma or Ar/H$_2$ plasma pre-treatment.

According to one embodiment of the method of the invention, step c) is implemented immediately after step d), without any other additional pre-treatment.

Advantageously, the silver substrate 1, 10 can be heat treated before step b) or before step c) in order to release any potential internal stresses connected to the previous machining steps or layer deposition steps. The treatment temperatures and times depend on the nature of the substrate and the layers, and must not affect the aesthetics of the part before the deposition of the protective layer in step c). The heat treatment parameters are known to a person skilled in the art and do not require further explanation herein.

According to another embodiment, the method of the invention comprises an additional intermediate step e), between step d) and step c), of carrying out an oxidation pre-treatment, enabling the creation of AgO/Ag$_2$O sites forming covalent bonds between the Al$_2$O$_3$ present in the first layer 4a and the silver of the final silver surface of the substrate so as to facilitate the adhesion of the protective layer 4 on the substrate.

According to one alternative embodiment, the oxidation pre-treatment of step e) can consist of a plasma oxidation pre-treatment using an oxidising agent such as oxygen, or Ar/O$_2$, enabling the AgO/Ag$_2$O sites to be created.

The dosage of O$_2$ in the plasma must be precise so as to create a sufficient amount of AgO/Ag$_2$O sites, however which tend to yellow the silver, while guaranteeing the whiteness of the silver.

The plasma treatment parameters are known to a person skilled in the art and do not require further explanation herein.

According to another alternative embodiment, the oxidation pre-treatment of step e) can consist of injecting water or hydrogen peroxide, in liquid form, into a pre-treatment chamber in a vacuum causing the water or hydrogen peroxide to vaporise which, on contact with the substrate, will form the AgO/Ag$_2$O sites. The quantity of water or hydrogen peroxide injected is equal to about several tens of micromoles.

In a particularly advantageous manner, step e) is carried out without venting between step d) and said step e). For this purpose, the substrate pre-treated according to step d) undergoes the additional pre-treatment according to step e) without breaking the vacuum.

Moreover, the substrate derived from step b) and pre-treated according to step d) only or according to steps d) and e) is then advantageously transferred in a vacuum into a deposition chamber, preferably an ALD deposition chamber, in order to directly implement step c) on the pre-treated substrate derived from step d) or from steps d) and e), without venting the final silver surface of the substrate.

For this purpose, the pre-treatment steps d) and e) and the protective layer deposition step c), preferably by ALD, are advantageously implemented in the same comprehensive treatment machine wherein the pre-treatment device according to step d) or according to steps d) and e) is integrated into the protective layer 4 deposition device, preferably the ALD device, enabling comprehensive treatment without venting of the final silver surface of the substrate, and preferably in a vacuum, in order to implement step d), potentially step e) where present, and step c).

A substrate comprising a final silver surface treated according to the method of the invention, has a layer for the protection of silver against tarnishing without adhesion defects. Moreover, and in particular when the layer for the protection of silver against tarnishing has been deposited by ALD, the very white effect of the silver is preserved, despite the presence of the layer for the protection of silver against tarnishing. If the substrate has been engine turned, the fine details of the guilloché work remain clearly visible, despite the presence of said layer for the protection of silver against tarnishing.

Jewellery, writing instrument, glasses and leather products can also be advantageously treated using this method.

The invention claimed is:

1. A method for making a final silver surface that is protected against tarnishing, the method comprising:
   depositing a layer comprising a silver-copper alloy on an initial silver surface, obtaining the final silver surface; and
   depositing a first layer of a metal oxide or a nitride and optionally a second layer of a metal oxide or a nitride different than the first layer on at least one part of the final silver surface to protect the final silver surface against tarnishing,
   wherein the initial silver surface is formed by depositing an intermediate layer of silver on a non-silver substrate,
   wherein the intermediate layer of silver has a thickness in the range of 200 nm to 3,000 nm,
   wherein the silver-copper alloy comprises between 0.1 wt % and 10 wt % copper relative to the total weight of the alloy,
   wherein the first layer has a thickness in the range of 1 nm to 200 nm, and
   wherein the second layer, if present, has a thickness in the range of 1 nm to 200 nm.

2. The method according to claim 1, wherein the intermediate layer of silver has a thickness in the range of 200 nm to 600 nm.

3. The method according to claim 1, wherein the intermediate layer of silver has a thickness in the range of 1,000 nm to 3,000 nm.

4. The method according to claim 3, wherein the intermediate layer of silver has a thickness in the range of 2,500 nm to 3,000 nm.

5. The method according to claim 1, wherein the silver-copper alloy layer has a thickness in the range 200 nm to 600 nm.

6. The method according to claim 1, wherein the silver-copper alloy comprises between 0.5 wt % and 7 wt % of copper relative to the total weight of the alloy.

7. The method according to claim 1, wherein the first layer is of a metal oxide, optionally the second layer is of a metal oxide, and the metal oxide of the first layer and optionally the metal oxide of the second layer are independently selected from the group consisting of Al$_2$O$_3$, Ta$_2$O$_5$, HfO$_2$, ZnO, SiO$_2$, and TiO$_2$.

8. The method according to claim 1, wherein the first layer and the second layer are deposited on at least one part of the final silver surface, and
wherein the metal oxide of the first layer is $Al_2O_3$ and the metal oxide of the second layer is $TiO_2$.

9. The method according to claim 8, further comprising a plasma treating before and/or after the step of depositing the second $TiO_2$ layer.

10. The method according to claim 8, wherein the first layer has a thickness in the range of 1 nm to 100 nm, and
wherein the second layer has a thickness in the range of 1 nm to 100 nm.

11. The method according to claim 10, wherein the first layer has a thickness in the range of 30 nm to 50 nm,
and wherein the second layer in the range of 10 nm to 50 nm.

12. The method according to claim 1, wherein the depositing of the first layer and optionally the second layer is carried out by a method chosen from the group consisting of ALD, PVD, CVD, and sol-gel.

13. The method according to claim 12, wherein the depositing of the first layer and optionally the second layer is carried out by ALD.

14. The method according to claim 1, further comprising heat treating the initial silver surface before depositing the layer comprising the silver-copper alloy and/or heat treating the final silver surface before the depositing of the first layer and optionally the second layer.

15. The method according to claim 1, further comprising plasma treating the final silver surface before the depositing of the first layer and optionally the second layer.

16. The method according to claim 15, wherein the plasma of the plasma treatment consists of an Ar plasma or an $Ar/H_2$ plasma.

17. The method according to claim 15, wherein the plasma treatment and the depositing of the first layer and optionally the second layer are implemented in the same comprehensive treatment machine.

18. The method according to claim 15, further comprising pre-treating by oxidation the final silver surface between the plasma treatment and the depositing of the first layer and optionally the second layer.

19. The method according to claim 18, wherein the oxidation pre-treatment consists of pretreating with a plasma of an oxidising agent.

20. The method according to claim 18, wherein the oxidation pretreatment consists of injecting water or hydrogen peroxide, in liquid form, into a pre-treatment chamber in a vacuum.

21. The method according to claim 18, wherein the plasma treatment and the oxidation pre-treatment are implemented in the same comprehensive treatment machine.

22. The method according to claim 18, wherein the oxidation pre-treatment and the depositing of the first layer and optionally the second layer are implemented in the same comprehensive treatment machine.

23. The method according to claim 22, wherein the plasma treatment, the oxidation pre-treatment, and the depositing of the first layer and optionally the second layer are implemented in the same comprehensive treatment machine.

24. The method according to claim 1, wherein the initial silver surface and/or the non-silver substrate is a horological element.

25. The method according to claim 24, wherein a structuring is produced on the surface of the initial silver surface and/or the non-silver substrate.

26. The method according to claim 1, wherein the non-silver substrate is metallic.

27. The method according to claim 23, wherein the non-silver substrate is gold.

28. The method according to claim 1, wherein the second layer is not deposited.

* * * * *